United States Patent
Tan

(10) Patent No.: US 10,312,126 B1
(45) Date of Patent: Jun. 4, 2019

(54) TCB BOND TIP DESIGN TO MITIGATE TOP DIE WARPAGE AND SOLDER STRETCHING ISSUE

(71) Applicant: Micron Technology, Inc., Boise, ID (US)

(72) Inventor: Yet Hong Tan, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/830,648

(22) Filed: Dec. 4, 2017

(51) Int. Cl.

| | |
|---|---|
| *H01L 21/768* | (2006.01) |
| *H01L 21/67* | (2006.01) |
| *H05K 3/34* | (2006.01) |
| *B32B 37/10* | (2006.01) |
| *H05K 13/04* | (2006.01) |
| *H01L 21/683* | (2006.01) |
| *H01L 23/00* | (2006.01) |
| *H01L 25/065* | (2006.01) |
| *H01L 25/00* | (2006.01) |

(52) U.S. Cl.
CPC .......... *H01L 21/6838* (2013.01); *H01L 24/75* (2013.01); *H01L 25/0657* (2013.01); *H01L 25/50* (2013.01); *H01L 2224/75745* (2013.01); *H01L 2225/06513* (2013.01); *H01L 2225/06517* (2013.01)

(58) Field of Classification Search
CPC ..... H01L 2224/131; H01L 2224/81191; H01L 2224/75745; H01L 2224/75252; H01L 2224/75502; H01L 2224/75301; H01L 2224/75981; H01L 2224/81203; H01L 2224/75312; H01L 2224/75302; H01L 2924/014; H01L 2224/13147; H01L 2924/00014

See application file for complete search history.

(56) References Cited

U.S. PATENT DOCUMENTS

| | | | |
|---|---|---|---|
| 2010/0059904 A1* | 3/2010 | Kasumi | ................. B29C 59/022 264/293 |
| 2012/0088362 A1* | 4/2012 | Hwang | ................... H01L 24/16 438/615 |
| 2013/0181037 A1* | 7/2013 | Nagai | ..................... H01L 24/75 228/103 |
| 2014/0202636 A1* | 7/2014 | Mayr | .................. B29C 66/9121 156/378 |

* cited by examiner

*Primary Examiner* — Brian Turner
(74) *Attorney, Agent, or Firm* — Parsons Behle & Latimer

(57) ABSTRACT

A semiconductor tool and methods of forming semiconductor device assemblies. The semiconductor tool is a bond tip having a vacuum port and a plurality of purge ports with channels coupling the vacuum port with the purge ports. Air may be withdrawn through the vacuum to create a vacuum on the bottom of the bond tip to selectively couple a semiconductor device with the bond tip. The bond tip positions the semiconductor device on top of a stack of semiconductor devices to form a semiconductor device assembly. The assembly may be heated to reflow interconnects between the semiconductor device and the top device of the stack of semiconductor devices. Fluid provided through the purge ports may help to counter warpage of the semiconductor device to help form adequate interconnects between the devices. Fluid may also be provided through the vacuum port to counter the warpage.

15 Claims, 5 Drawing Sheets

TCB BOND TIP DESIGN TO MITIGATE TOP DIE WARPAGE AND SOLDER STRETCHING ISSUE

FIELD

The embodiments described herein relate to semiconductor tools and methods of forming semiconductor device assemblies. The semiconductor tool may be a bond tip having a vacuum port and purge ports with channels coupling the vacuum port with the purge ports. The vacuum port may be used to selectively couple a semiconductor device to the bond tip, and fluid flowing through both the purge ports and the vacuum port may enable adequate interconnects to be formed between the semiconductor device coupled to the bond tip and another semiconductor device.

BACKGROUND

Semiconductor device assemblies, including, but not limited to, memory chips, microprocessor chips, and imager chips, typically include a semiconductor device, such as a die, mounted on a substrate. The semiconductor device assembly may include various functional features, such as memory cells, processor circuits, and imager devices. The semiconductor device assembly may include semiconductor devices stacked upon and electrically connected to one another by interconnects between adjacent devices.

Various methods and/or techniques may be employed to electrically interconnect adjacent semiconductor devices and/or substrates in a semiconductor device assembly. For example, individual interconnects may be formed by reflowing tin-silver (SnAg), also known as solder, to form interconnects between the semiconductor devices. Individual interconnects may be formed by reflowing various materials such as, but not limited to, tin-silver-copper solder, indium, or the like, as would be recognized by one of ordinary skill in the art having the benefit of this disclosure.

FIG. 7 shows a prior art semiconductor device assembly 200 that includes a stack of semiconductor devices 220, 230, 240, 250 on a substrate 210. A plurality of interconnects 225, 235, 245, 255 connect the semiconductor devices 220, 230, 240, 250 to each other as well as the substrate 210. A bond tip 260 may be used to selectively position the upper most, top, or last semiconductor device 250 to the stack of semiconductor devices 240, 230, 220, as discussed herein. The withdrawal of air (not shown) through a vacuum port 263 via a flow unit 280 fluidly coupled to the vacuum port 263 via a conduit 285 creates a vacuum on the bottom surface 262, shown in FIG. 6, of the bond tip 260.

FIG. 6 is a schematic showing a bottom surface of a prior art bond tip 260. The vacuum port 263 if fluidly coupled with channels or grooves 264-271 in the bottom surface 262 of the bond tip 260. Fluidly coupling the channels 264-271 with the vacuum port 263 enables a vacuum to be formed along the bottom 262 of the bond tip 260 as air is withdrawn (not shown) via the flow device 280 (shown in FIG. 7) to selectively couple or attach a semiconductor device to the bottom surface 262 of the bond tip 260.

FIG. 7 shows the top semiconductor device 250 positioned adjacent to stack of semiconductor devices 240, 230, 220 via the bond tip 260. The withdrawal of air (not shown) creates a vacuum to selectively attach or couple the semiconductor device 250 to the bond tip 260. The semiconductor device assembly 200 is then heated to a predetermined temperature to reflow the interconnects 225, 235, 245, 255 between the semiconductor devices 220, 230, 240, 250 and the substrate 210. As the semiconductor device assembly 200 is heated, the semiconductor device 250 may assume an intrinsic warpage profile, which may result in the inadequate formation of interconnects between the top semiconductor device 250 and the adjacent semiconductor device 240. For example, the interconnects 225E along the outer edges of the semiconductor device 250 may become stretched, as shown in FIG. 7, forming inadequate interconnects between the two semiconductor devices 250, 240.

Pressure may be applied to the top surface 261 of the bond tip 260 in an effort to prevent the interconnects 255E along the outer edges or periphery of the semiconductor device 250 from stretching due to the warpage of the semiconductor device 250. Likewise, the flow device 280 may flow a fluid, shown as arrows F, through the vacuum port 263 against the top surface of the top semiconductor device 250 in an effort to prevent the interconnects 255E along the periphery of the semiconductor device 250 from stretching due to the warpage of the semiconductor device 250. However, even the applied pressure and fluid flowing, shown as arrows F, through the vacuum port 263 may not be adequate to prevent the interconnects 255E along the periphery from stretching during the reflow process.

Additional drawbacks and disadvantages may exist.

Figure 1:
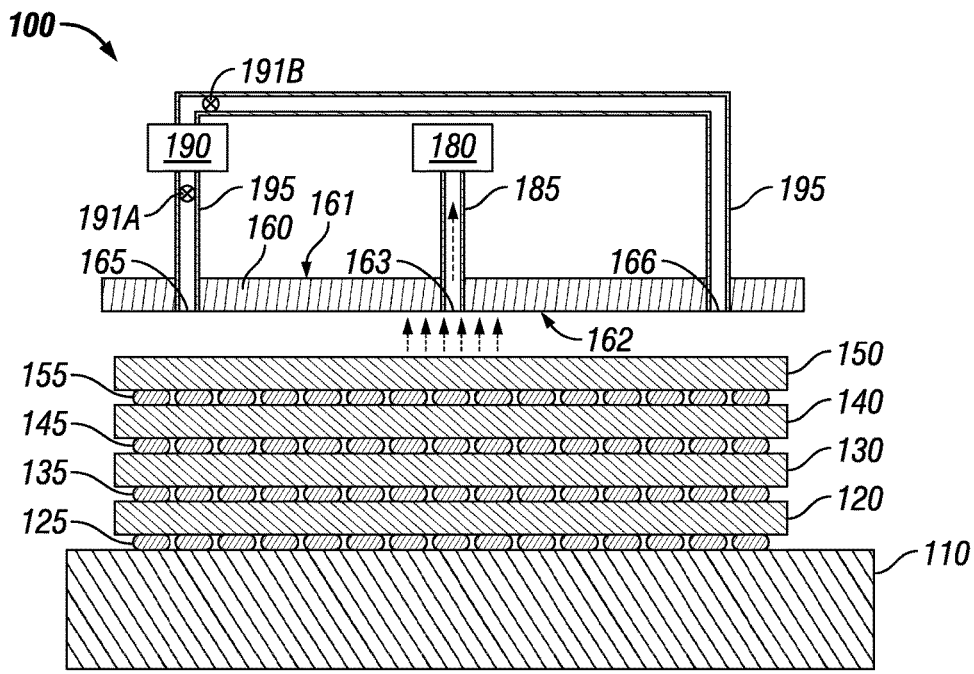
FIG. 1 is a schematic showing an embodiment of a bond tip positioning a semiconductor device on top of a stack of semiconductor devices.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor tools and methods of forming semiconductor device assemblies. In one embodiment of the disclosure a semiconductor tool comprises a bond tip having a vacuum port and a first purge port with a first channel coupling the vacuum port with the first purge port. A first flow unit is coupled to the vacuum port with the first flow unit being configured to withdraw air through the vacuum port in a first mode of operation and provide a fluid through the vacuum port in a second mode of operation. A second flow unit is coupled to the purge port with the second flow unit being configured to provide a fluid through the first purge port.

In one embodiment of the disclosure, a system comprises a bond tip having a central vacuum port, a plurality of purge ports, and a plurality of channels fluid coupling the vacuum port with each of the plurality of purge ports, which are located along the periphery of the bond tip. The system includes a first flow unit, a second flow unit, and a substrate. At least one semiconductor is on the substrate and a final semiconductor device is selectively attached to the bond tip by withdrawing air through the central vacuum port via the first flow unit. The final semiconductor device is configured to be attached on top of the at least one semiconductor device on the substrate. The at least one semiconductor device may comprises two or more semiconductor devices stacked on the substrate with the final semiconductor device be configured to be attached on top of the stack of semiconductor devices.

In one embodiment of the disclosure, a method of forming a semiconductor device assembly comprises withdrawing air through a vacuum port in a bond tip to selectively attach a first surface of a first semiconductor device to a bottom surface of the bond tip. The method includes positioning the first semiconductor device adjacent to a second semiconductor device and heating the first and second semiconductor devices to a predetermined temperature to reflow a plurality of interconnects between a second surface of the first semiconductor device and the second semiconductor device. The method includes flowing a fluid through a plurality of purge ports in the bond tip, the fluid flowing against the first surface of the first semiconductor device and stopping the withdrawal of air through the vacuum port upon heating the first and second semiconductor devices to the predetermined temperature. The method includes flowing a fluid through the vacuum port in the bond tip after flowing fluid through the plurality of purge ports, the fluid through the vacuum port flowing against the first surface of the first semiconductor device.

FIG. 1 shows a schematic of a system, or semiconductor device assembly, 100 that includes a plurality of semiconductor devices 120, 130, 140, 150 that are stacked onto a top or first surface of a substrate 110. The lower most semiconductor device 120 is electrically connected to the substrate 110 via a plurality of interconnects 125. Likewise, the other semiconductor devices 130, 140, 150 are electrically connected to each other via interconnects 135, 145, 155 as would be appreciated by one of ordinary skill in the art having the benefit of this disclosure. A tool, referred to herein as a bond tip, 160 is used to position and connect the top or final semiconductor device 150 to the stack of semiconductor devices 120, 130, 140 positioned on the substrate 110, as discussed herein. The number, size, shape, and/or configuration of the substrate 110, semiconductor devices 120, 130, 140, 150, and interconnects 125, 135, 145, 155 are shown for illustrative purposes and may be varied depending on the application as would be appreciated by one of ordinary skill in the art having the benefit of this disclosure. For example, the stack of semiconductor devices may comprise, but is not limited to, two semiconductor devices, four semiconductor devices, eight semiconductor devices, or any other number of semiconductor devices.

The bond tip 160 is used to selectively move the top or final semiconductor device 150 to the top of the stack of semiconductor devices 120, 130, 140. A first flow unit 180 is used to withdraw air, or in other words provide a vacuum indicated by arrows V, to a vacuum port 163 on the bottom or second surface 162 of the bond tip 160. The first flow unit 180 may be configured to withdraw air, arrows V, via conduit 185 in a first mode of operation and input or flow a fluid, arrows Pc shown in FIG. 4, into conduit 185 in a second mode of operation. Alternatively, two units could be provided with one unit configured to withdraw air and the other unit configured to input or flow a fluid into the conduit 185 as would be appreciated by one of ordinary skill in the art having the benefit of this disclosure.

The fluid may be air, nitrogen, and/or other fluids as would be appreciated by one of ordinary skill in the art having the benefit of this disclosure. The conduit 185 provides communication between the first flow unit 180 and the vacuum port 163, which extends from the first or top surface 161 of the bond tip 160 to the second or bottom surface 162 of the bond tip 160. The withdrawal of air, arrows V, from the vacuum port 163 via conduit 185 and the first flow unit 180 provides a vacuum to selectively connect the top surface of the semiconductor device 150 to the bottom surface 162 of the bond tip 160. Once the semiconductor device 150 is selectively connected to the bottom surface 162 of the bond tip 160, the bond tip 160 may be used to position the semiconductor device 150 adjacent to the semiconductor device 140.

The system 100 may then be heated to a predetermined temperature, which reflows the interconnects 125, 135, 145, 155 between the semiconductor devices 120, 130, 140, 150. Pressure is applied to the top surface 161 of the bond tip 160 to potentially enable adequate interconnects between the semiconductor devices 120, 130, 140, 150. Fluid flowing, arrows P in FIGS. 2-4, out of the purge ports 164 (shown in FIG. 5), 165, 166, and 167 (shown in FIG. 5) also may enable adequate interconnects between the semiconductor devices 120, 130, 140, 150, as discussed herein. In other words, the flow of fluid, arrows P, out of the purge ports 164, 165, 166, 167 may alleviate stretching of the interconnects at the edges between the semiconductor devices 140, 150, as discussed herein.

While the first flow unit 180 provides a vacuum to selectively connect the top surface of the semiconductor device 150 to the bottom surface 162 of the bond tip 160 the purge ports 164, 165, 166, 167, which are in communication with the vacuum port 163, as discuss herein, may be a closed system. For example, a second flow unit 190 may be connected to the purge ports 164, 165, 166, 167 via conduits 195 with a valve 191A, 191B positioned between the first flow unit 190 and a respective purge port 165, 166. Although only two valves 191A, 191B as shown in FIG. 1, each purge port 164, 165, 166, 167 may have a corresponding valve as would be appreciated by one of ordinary skill in the art having the benefit of this disclosure. The valves 191A, 191B may be closed while the first flow unit 180 withdraws air through the vacuum port 163 and while the second flow unit 190 does not provide a fluid through the purge ports 164, 165, 166, 167, as shown in FIG. 1. Alternatively, second flow unit 190 may provide a closed system with the purge ports 164, 165, 166, 167 while not providing any fluid.

Figure 2:
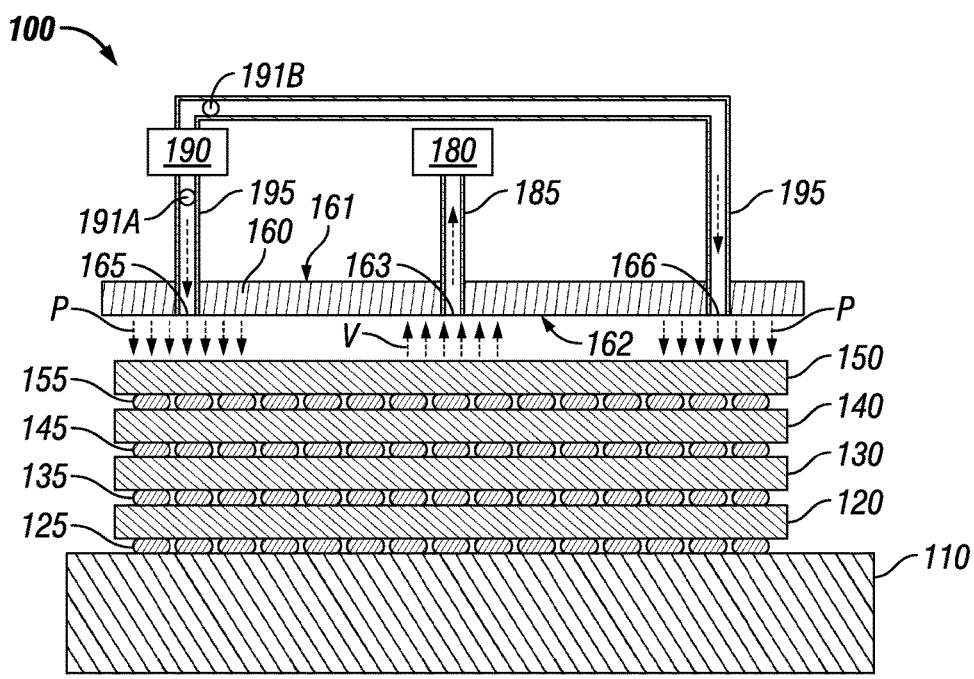
FIG. 2 is a schematic showing an embodiment of a bond tip positioning a semiconductor device on top of a stack of semiconductor devices.

FIG. 2 shows a schematic of the system, or semiconductor device assembly, 100 as the system 100 has been heated to a predetermined temperature. The predetermine temperature is the temperature at which the interconnects 125, 135, 145, 155 between the semiconductor devices 120, 130, 140, 150 will reflow. For example, the predetermined temperature may be, but is not limited to, 225 degrees Celsius. However, the predetermined temperature may be varied depending on the application as would be appreciated by one of ordinary skill in the art having the benefit of this disclosure.

Figure 6:
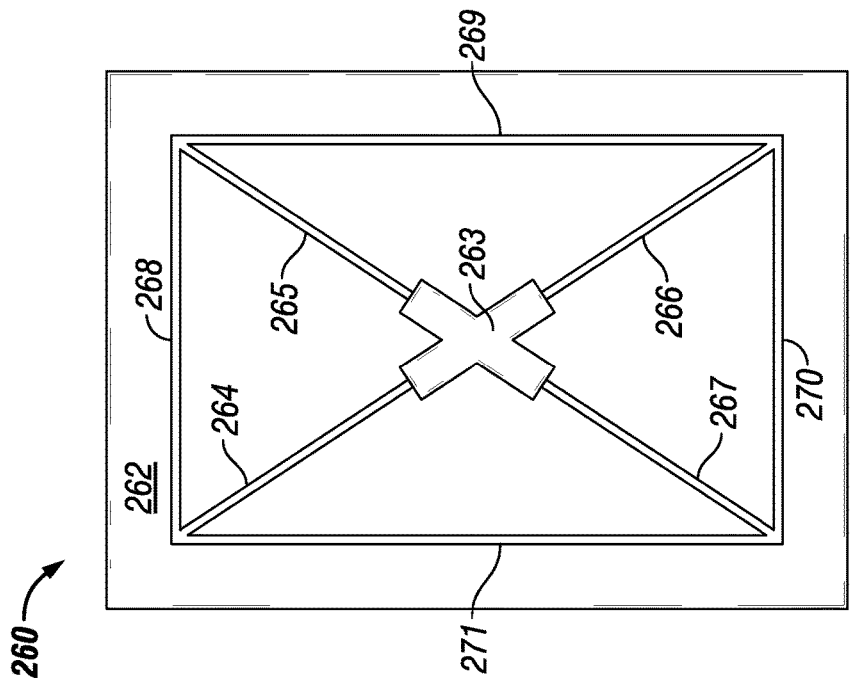
FIG. 6 is a schematic showing a bottom surface of a prior art bond tip.

Upon reaching the predetermine temperature, a second flow unit 190 provides a flow of fluid, shown as arrows P, to purge ports 164 (shown in FIG. 5), 165, 166, 167 (shown in FIG. 5) via conduits 195. If a valve 191A, 191B is positioned between the second flow unit 190 and the purge ports 165, 166, the valves 191A, 191B will be opened to permit the second flow unit 190 to flow fluid, shown as arrows P, through the purge ports 164, 165, 166, 167 against the top surface of the top semiconductor device 150. The fluid flow, arrows P, through the purge ports 164, 165, 166, 167 against the top surface of the top semiconductor device 150 applies pressure to the top semiconductor device 150 along the periphery or outer edges to prevent the interconnects 155 along the edges from stretching due to an intrinsic warpage profile of the top semiconductor device 150. Flowing fluid out of purge ports 164, 165, 166, 167 against the top surface of the semiconductor device 150 provides for more force against the top surface of the semiconductor device 150 as compared to the bond tip 260 of FIG. 6. FIGS. 1-4 show four semiconductor devices 120, 130, 140, 150 for illustrative purposes. The bond tip 160 of the present disclosure may be used to prevent interconnects between a top semiconductor device and an adjacent semiconductor device from stretching due to an intrinsic warpage profile of the top semiconductor device whether the stack of semiconductor devices comprises two semiconductor devices, three semiconductor devices, four semiconductor devices, eight semiconductor devices, or any other number of semiconductor devices as would be appreciated by one of ordinary skill in the art having the benefit of this disclosure.

As shown in FIG. 2, fluid may be flowed out of the purge ports 164, 165, 166, 167, shown as arrows P, while air is withdrawn, shown as arrows V, by the first flow unit 180 through the vacuum port 163. The system 100 may both flow fluid, arrows P, through the purge ports 164, 165, 166, 167 and withdraw air, arrows V, through the vacuum port 163 for a relatively short duration. For example, the system 100 may provide both purge flow, arrows P, and withdraw air, arrows V, for a range between 0 to 0.3 seconds. This range of providing both purge flow, arrows P, and withdraw air, arrows V, may be varied depending on the application as would be appreciated by one of ordinary skill in the art having the benefit of this disclosure.

Figure 3:
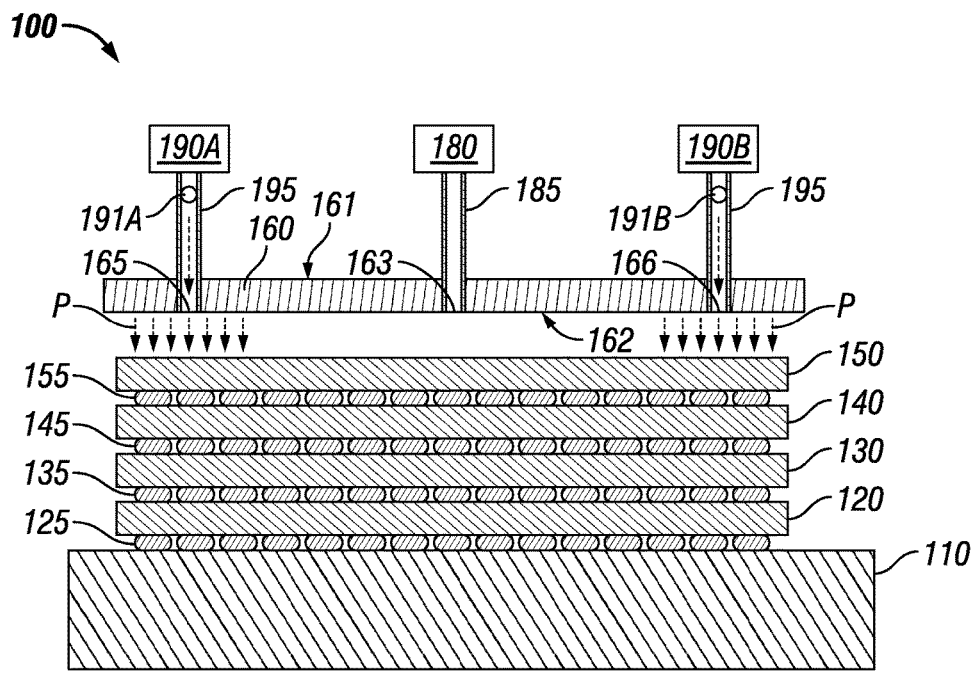
FIG. 3 is a schematic showing an embodiment of a bond tip positioning a semiconductor device on top of a stack of semiconductor devices.

FIG. 3 shows a schematic of the system, or semiconductor device assembly, 100 after the first flow unit 180 has stopped withdrawing air though the vacuum port 163 and conduit 185. The system 100 continues to provide fluid, shown as arrows P, through the purge ports 164 (shown in FIG. 5), 165, 166, 167 (shown in FIG. 5) via conduits 195. Instead of a single second control unit 190 configured to provide fluid to each of the purge ports 164, 165, 166, 167, the system 100 may include a flow unit for each individual purge port 164, 165, 166, 167. As shown in FIG. 3, a second flow unit 190A provides fluid flow, arrows P, to purge port 165 via conduit 195 and a third flow unit 190B provides fluid flow, arrows P, to purge port 166 via conduit 195. Likewise, a fourth flow unit (not shown) may provide fluid flow to purge port 164 and a fifth flow unit (not shown) may provide fluid flow to purge port 167 as would be appreciated by one of ordinary skill in the art having the benefit of this disclosure.

As discussed herein, the fluid flow, arrows P, through the purge ports 164, 165, 166, 167 against the top surface of the top semiconductor device 150 applies pressure to the top semiconductor device 150 along the periphery or outer edges to prevent the interconnects 155 along the edges from stretching due to an intrinsic warpage profile of the top semiconductor device 150. As shown in FIG. 3, the system 100 may flow fluid out of the purge ports 164, 165, 166, 167, shown as arrows P, without withdrawing air through the vacuum port 163 or providing fluid flow against the top semiconductor 150 through the vacuum port 163. The system 100 may both flow, arrows P, through the purge ports 164, 165, 166, 167 and withdraw air, arrows V, through the vacuum port 163 for a relatively short duration. For example, the system 100 may provide both purge flow, arrows P, and withdraw air, arrows V, for a range between 0 to 0.3 seconds. This range of providing both purge flow, arrows P, and withdraw air, arrows V, may be varied depending on the application as would be appreciated by one of ordinary skill in the art having the benefit of this disclosure. The system 100 may provide a delay of the first flow unit 180 as it switches from a first mode of operation of withdrawing air, arrows V, through the vacuum port 163 and a second mode of operation of providing fluid, arrows Pc (shown in FIG. 4) through vacuum port 163. The delay may be range between 0.1 to 0.3 seconds. This range for switching between the first mode of operation and the second mode of operation of the first flow unit 180 may be varied depending on the application as would be appreciated by one of ordinary skill in the art having the benefit of this disclosure.

Figure 4:
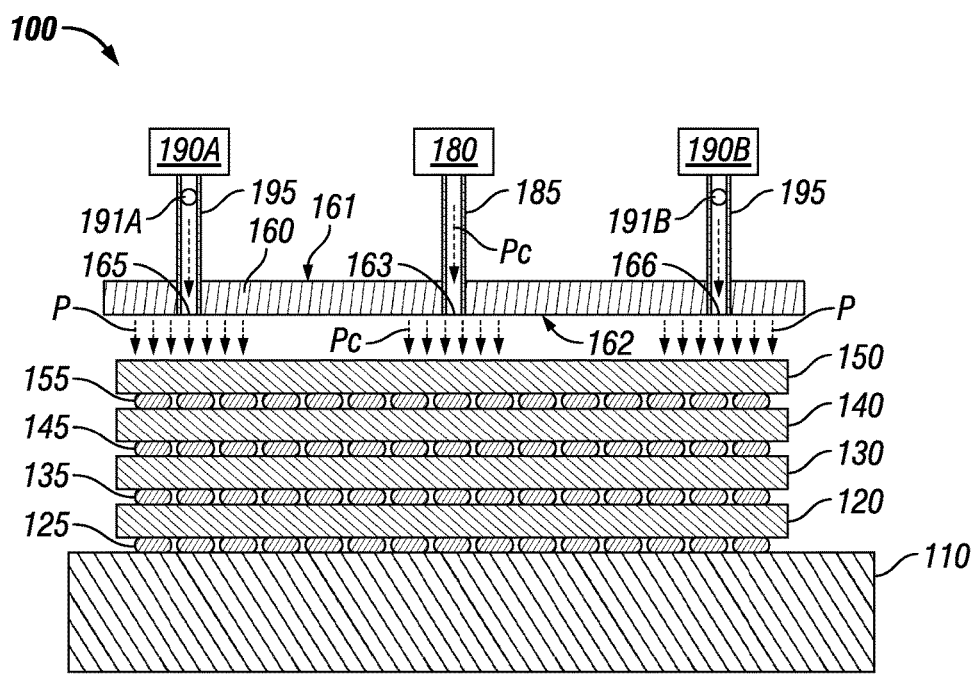
FIG. 4 is a schematic showing an embodiment of a bond tip positioning a semiconductor device on top of a stack of semiconductor devices.

FIG. 4 shows a schematic of the system 100 with the first flow unit 180 providing fluid, shown as arrows Pc, though the vacuum port 163 via conduit 185 and also providing fluid, shown as arrows P, through the purge ports 164 (shown in FIG. 5), 165, 166, 167 (shown in FIG. 5) via conduits 195. The purge flow, arrows Pc, through the vacuum port 163 and the purge flow, arrows P, through the purge ports 164, 165, 166, 167 will continue until interconnects 125, 135, 145, 155 have cooled and formed within the semiconductor device assembly 100. The system 100 may be configured to provide the purge flow, arrows Pc, through the vacuum port 163 and the purge flow, arrows P, through the purge ports 164, 165, 166, 167 the semiconductor device assembly 100 has cooled to a second predetermined temperature has been reached. The second predetermined temperature may be varied depending on the application as would be appreciated by one of ordinary skill in the art having the benefit of this disclosure.

Figure 5:
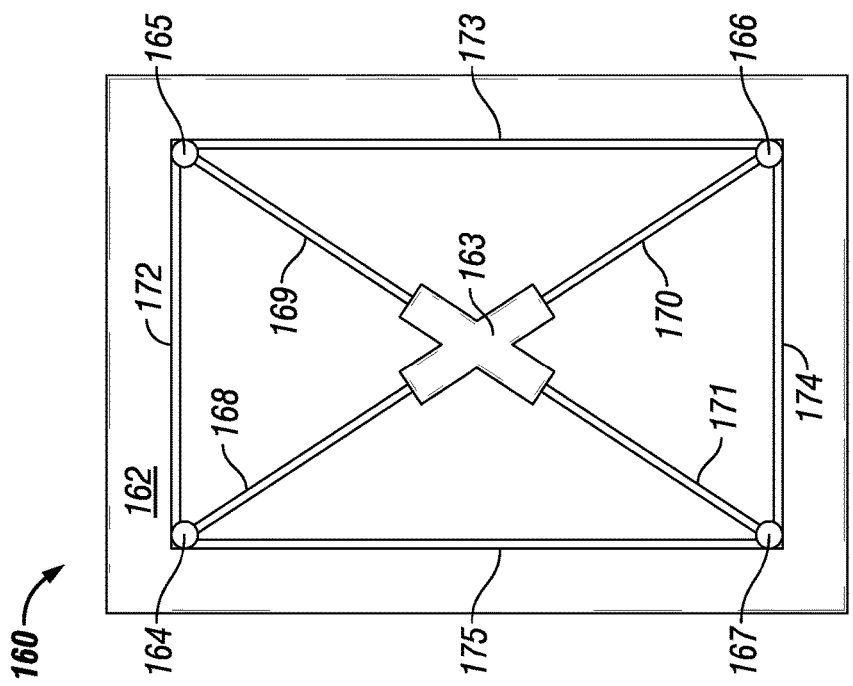
FIG. 5 is a schematic showing a bottom surface of an embodiment of a bond tip.
Figure 7:
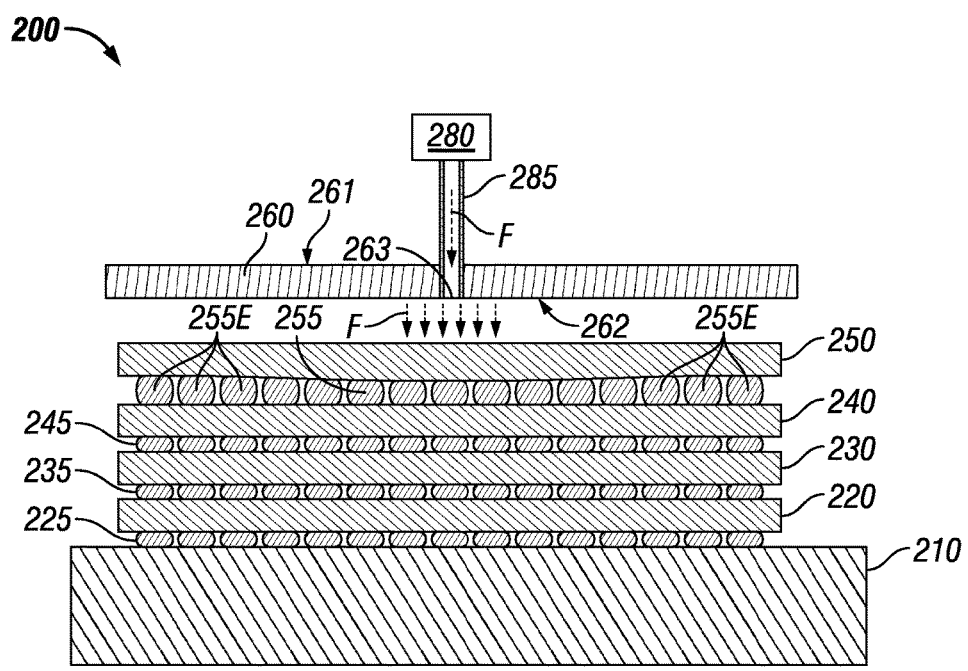
FIG. 7 is a schematic showing a prior art bond tip positioning a semiconductor device on top of a stack of semiconductor devices.

FIG. 5 is a schematic showing a bottom surface of an embodiment of a bond tip 160. The bond tip 160 include a vacuum 163, which may be located in the general center of the bond top 160. The bond tip 160 includes purge ports 164, 165, 166, 167, which may be located along the periphery of the bond tip 160. The purge ports 164, 165, 166, 167 may each be substantially located adjacent to corners of the bond tip, as shown in FIG. 5. The bond tip 160 includes a plurality of channels, or grooves, that fluidly couple the vacuum port 163 and the purge ports 164, 165, 166, 167, as discussed herein. A first channel 168 fluidly couples the vacuum port 163 with a first purge port 164. Likewise, a second channel 169 fluidly couples the vacuum port 163 with a second purge port 165, a third channel 170 fluidly couples the vacuum port 163 with a third purge port 166, and a fourth channel 171 fluidly couples the vacuum port 163 with a fourth purge port 167. A fifth channel 172 fluidly couples the first purge port 164 with the second purge port 165. Likewise, a sixth channel 173 fluidly couples the second purge port 165 with the third purge port 166, a seventh channel 174 fluidly couples the third purge port 166 with the fourth purge port 167, and an eight channel 175 fluid couples the fourth purge port 167 with the first purge port 164. The channels 168-175 are configured to provide a vacuum along each channel 168-175 when the bottom of the bond tip 160 is engaged with a semiconductor device while air is withdrawn through the vacuum port 163, as discussed herein. The shape, configuration, number, and location of the channels and ports are shown for illustrative purposes and may be varied depending on the application as would be appreciated by one of ordinary skill in the art having the benefit of this disclosure.

Figure 8:
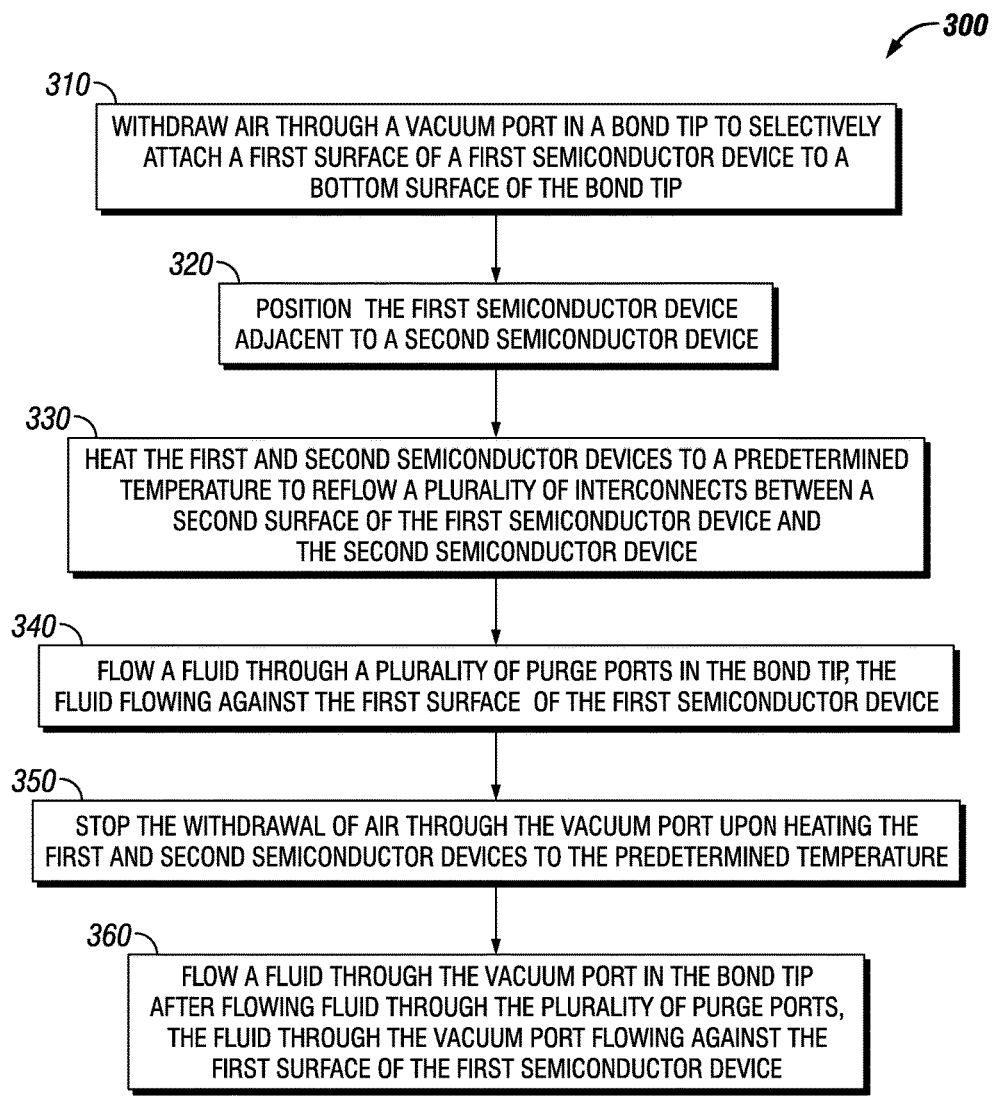
FIG. 8 is a flow chart of an embodiment of a method of forming a semiconductor device assembly.

FIG. 8 is a flow chart of an embodiment of a method 300 of forming a semiconductor device assembly. The method 300 includes withdrawing air through a vacuum port in a bond tip to selectively attach a first surface of a first semiconductor device to a bottom surface of the bond tip, at step 310. At step 320, the method 300 includes positioning the first semiconductor device adjacent to a second semiconductor device and includes heating the first and second semiconductor devices to a predetermined temperature to reflow a plurality of interconnects between a second surface of the first semiconductor device and the second semiconductor device, at step 330. The method 300 includes flowing a fluid through a plurality of purge ports in the bond tip, the fluid flowing against the first surface of the first semiconductor device, at step 340.

At step 350, the method 300 includes stopping the withdrawal of air through the vacuum port upon heating the first and second semiconductor devices to the predetermined temperature. Flowing a fluid through a plurality of purge ports in the bond tip may occur prior to stopping the withdrawal of air through the vacuum port. In one embodiment, the fluid may be flowed through the purge ports may be, but is not limited to, 0.1 seconds to 0.3 seconds prior to stopping the withdrawal of air through the vacuum port. The overlap of flowing fluid through the purge ports and withdrawing air through the vacuum port may be varied depending on the application as would be appreciated by one of ordinary skill in the art having the benefit of this disclosure.

The method 300 includes flowing a fluid through the vacuum port in the bond tip after flowing fluid through the plurality of purge ports, the fluid through the vacuum port flowing against the first surface of the first semiconductor device, at step 360. The flowing of fluid through the purge ports and the vacuum port may enable sufficient interconnects to be formed between the first semiconductor device and the second semiconductor device.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor tool comprising:
   a bond tip having a vacuum port and a first purge port, a first channel coupling the vacuum port with the first purge port;
   a first flow unit coupled to the vacuum port, the first flow unit being configured to withdraw air through the vacuum port in a first mode of operation and provide a fluid through the vacuum port in a second mode of operation; and
   a second flow unit coupled to the first purge port, the second flow unit being configured to provide a fluid through the first purge port.

2. The tool of claim 1, wherein the second flow unit is configured to provide fluid through the first purge port prior to the first flow unit operating in the second mode of operation.

3. The tool of claim 1, the bond tip further comprising:
   a second purge port;
   a second channel coupling the vacuum port with the second purge port;
   a third purge port;
   a third channel coupling the vacuum port with the third purge port;
   a fourth purge port; and
   a fourth channel coupling the vacuum port with the fourth purge port.

4. The tool of claim 3, wherein second flow unit is configured to provide a fluid through the second purge port, to provide a fluid through the third purge port, and to provide a fluid through the fourth purge port.

5. The tool of claim 3, further comprising:
  a third flow unit coupled to the second purge port, the third flow unit being configured to provide a fluid through the second purge port;
  a fourth flow unit coupled to the third purge port, the fourth flow unit being configured to provide a fluid through the third purge port;
  a fifth flow unit coupled to the fourth purge port, the fifth flow unit being configured to provide a fluid through the fourth purge port.

6. The tool of claim 3, wherein the vacuum port is located substantially in a center of the bond tip and wherein the first, second, third, and fourth purge ports are each substantially located adjacent to corners of the bond tip.

7. The tool of claim 3, the bond tip further comprising:
  a fifth channel coupling the first purge port with the second purge port;
  a sixth channel coupling the second purge port with the third purge port;
  a seventh channel coupling the third purge port with the fourth purge port; and
  an eighth channel coupling the fourth purge port with the first purge port.

8. The tool of claim 7, wherein the first flow unit in the first mode of operation provides a vacuum within the first channel, second channel, third channel, fourth channel, fifth channel, sixth channel, seventh channel, and the eight channel.

9. The tool of claim 1, wherein the first flow unit in the first mode of operation is configured to selectively secure a semiconductor device to the bond tip.

10. The tool of claim 1, wherein the first flow unit is configured to have a delay when switching from the first mode of operation to the second mode of operation.

11. The tool of claim 10, wherein the delay is between 0 and 0.3 seconds.

12. A system comprising:
  a bond tip having a central vacuum port, a plurality of purge ports, and a plurality of channels fluid coupling the vacuum port with the plurality of purge ports, wherein the plurality of the purge ports are located along the periphery of the bond tip; and
  a first flow unit;
  a second flow unit;
  a substrate;
  at least one semiconductor device on the substrate; and
  a final semiconductor device selectively attached to the bond tip by withdrawing air through the central vacuum port via the first flow unit, wherein the final semiconductor device is configured to be attached on top of the at least one semiconductor device on the substrate.

13. The system of claim 12, wherein each of the semiconductor devices is a die.

14. The system of claim 12, wherein each of the flow units is configured to flow fluid through a port in the bond tip against the final semiconductor device while the final semiconductor device is attached to the semiconductor device on the substrate.

15. The system of claim 12, wherein the at least one semiconductor device further comprises at least two semiconductor devices stacked on the substrate, wherein the final semiconductor device is configured to be attached on top of the at least two semiconductors stacked on the substrate.

* * * * *